US010950520B2

(12) United States Patent
Huang et al.

(10) Patent No.: US 10,950,520 B2
(45) Date of Patent: Mar. 16, 2021

(54) ELECTRONIC PACKAGE, METHOD FOR FABRICATING THE SAME, AND HEAT DISSIPATOR

(71) Applicant: Siliconware Precision Industries Co., Ltd., Taichung (TW)

(72) Inventors: Yu-Lung Huang, Taichung (KR); Chee-Key Chung, Taichung (TW); Chang-Fu Lin, Taichung (TW); Kuo-Hua Yu, Taichung (TW); Wen-Shan Tsai, Taichung (TW); En-Li Lin, Taichung (TW); Kaun-I Cheng, Taichung (TW); Wei-Ping Wang, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 16/533,716

(22) Filed: Aug. 6, 2019

(65) Prior Publication Data
US 2020/0168523 A1    May 28, 2020

(30) Foreign Application Priority Data

Nov. 22, 2018  (TW) ................................. 107141676
Mar. 25, 2019  (TW) ................................. 108110299

(51) Int. Cl.
*H01L 23/367*   (2006.01)
*H01L 23/00*    (2006.01)
(Continued)

(52) U.S. Cl.
CPC .......... *H01L 23/3675* (2013.01); *F28F 13/18* (2013.01); *H01L 21/4882* (2013.01); *H01L 23/562* (2013.01)

(58) Field of Classification Search
CPC ...... H01L 23/3675; H01L 23/36; H01L 23/34
See application file for complete search history.

(56) References Cited

U.S. PATENT DOCUMENTS 5,194,935 A * 3/1993 Kitano .................. H01L 21/565
257/706
6,197,615 B1 * 3/2001 Song ................. H01L 23/49503
438/111
(Continued)

FOREIGN PATENT DOCUMENTS

DE   102014100491 A1 *  7/2015 ............. H01L 23/42
EP        3220729 A1 *  9/2017 ......... H05K 7/20418
(Continued)

OTHER PUBLICATIONS

Machine translation, Japanese Pat. Pub. No. S55-116295, translation date: Aug. 31, 2020, Espacenet, all pages. (Year: 2020).*
(Continued)

*Primary Examiner* — Victoria K. Hall
(74) *Attorney, Agent, or Firm* — Mintz Levin Cohn Ferris Glovsky and Popeo, P.C.; Peter F. Corless; Steven M. Jensen

(57) ABSTRACT

An electronic package is provided. A heat dissipator is bonded via a thermal interface layer to an electronic component disposed on a carrier. The heat dissipator has a concave-convex structure to increase a heat-dissipating area of the thermal interface layer. Therefore, the heat dissipator has a better heat-dissipating effect.

27 Claims, 15 Drawing Sheets

(51) Int. Cl.
*H01L 21/48* (2006.01)
*F28F 13/18* (2006.01)

(56) References Cited

U.S. PATENT DOCUMENTS

| | | | | |
|---|---|---|---|---|
| 6,870,246 | B1* | 3/2005 | Mullen | H01L 23/3675 257/678 |
| 8,397,518 | B1* | 3/2013 | Vistakula | A61F 7/007 62/3.5 |
| 8,420,446 | B2* | 4/2013 | Yo | H01L 23/49582 438/123 |
| 9,013,031 | B2* | 4/2015 | Im | H01L 23/3677 257/686 |
| 9,607,890 | B1* | 3/2017 | Baloglu | H01L 23/481 |
| 9,831,158 | B2* | 11/2017 | Hayashi | H01L 23/49503 |
| 9,978,661 | B2* | 5/2018 | Im | H01L 25/50 |
| 10,020,240 | B2* | 7/2018 | Ozawa | H01L 23/3185 |
| 10,347,551 | B2* | 7/2019 | Kishi | H01L 23/4334 |
| 10,541,156 | B1* | 1/2020 | Interrante | H01L 21/52 |
| 10,643,924 | B1* | 5/2020 | Shen | H01L 23/3675 |
| 10,748,830 | B2* | 8/2020 | Hayashida | H01L 24/49 |
| 10,777,476 | B2* | 9/2020 | Okabe | H01L 23/4334 |
| 2001/0045643 | A1* | 11/2001 | Katoh | H01L 23/34 257/706 |
| 2003/0025215 | A1* | 2/2003 | Lee | H01L 23/3142 257/796 |
| 2003/0157359 | A1* | 8/2003 | Uehara | B21K 23/00 428/600 |
| 2004/0012099 | A1* | 1/2004 | Nakayama | H01L 21/568 257/787 |
| 2004/0190259 | A1* | 9/2004 | Labanok | H01L 23/4006 361/704 |
| 2004/0232534 | A1* | 11/2004 | Seki | H01L 23/49582 257/678 |
| 2006/0027900 | A1* | 2/2006 | Takeuchi | H01L 23/4334 257/675 |
| 2006/0185896 | A1* | 8/2006 | Ikeda | H01L 23/40 174/520 |
| 2006/0231944 | A1* | 10/2006 | Huang | H01L 21/6835 257/706 |
| 2008/0218971 | A1* | 9/2008 | Coico | H01L 21/4871 361/704 |
| 2009/0059537 | A1* | 3/2009 | MacQuarrie | H01L 23/3675 361/711 |
| 2011/0133329 | A1* | 6/2011 | Takahashi | H01L 21/561 257/712 |
| 2012/0094438 | A1* | 4/2012 | Sirinorakul | H01L 23/4334 438/111 |
| 2012/0241942 | A1* | 9/2012 | Ihara | H01L 23/3675 257/712 |
| 2013/0044501 | A1* | 2/2013 | Rudisill | F21V 21/35 362/398 |
| 2013/0134574 | A1* | 5/2013 | Ihara | H01L 23/3675 257/706 |
| 2013/0306296 | A1* | 11/2013 | Uezato | H01L 21/4878 165/185 |
| 2013/0340988 | A1* | 12/2013 | Chu | H01L 23/36 165/185 |
| 2014/0015118 | A1* | 1/2014 | Bae | H01L 23/3675 257/713 |
| 2014/0061890 | A1* | 3/2014 | Lee | H01L 23/3128 257/701 |
| 2014/0117528 | A1* | 5/2014 | Byun | H01L 23/3675 257/713 |
| 2014/0252634 | A1* | 9/2014 | Hung | H01L 23/48 257/773 |
| 2014/0307390 | A1* | 10/2014 | Baker | H01L 23/3675 361/709 |
| 2014/0370660 | A1* | 12/2014 | Ihara | H01L 21/4875 438/122 |
| 2015/0130046 | A1* | 5/2015 | Lin | H01L 25/50 257/712 |
| 2015/0170989 | A1* | 6/2015 | Dhavaleswarapu | H01L 23/3675 257/712 |
| 2015/0179607 | A1* | 6/2015 | Ho | H01L 21/76251 438/118 |
| 2015/0187675 | A1* | 7/2015 | Tang | H01L 23/367 257/712 |
| 2015/0187679 | A1* | 7/2015 | Ho | H01L 23/367 257/690 |
| 2015/0214128 | A1* | 7/2015 | Lin | H01L 23/3675 257/712 |
| 2015/0217529 | A1* | 8/2015 | Nagasaka | H01L 23/34 100/35 |
| 2015/0235990 | A1* | 8/2015 | Cheng | H01L 24/97 257/712 |
| 2015/0262972 | A1* | 9/2015 | Katkar | H01L 25/50 257/48 |
| 2015/0279761 | A1* | 10/2015 | Bet-Shliemoun | H01L 23/42 257/714 |
| 2015/0311137 | A1* | 10/2015 | Oganesian | H01L 21/4871 257/712 |
| 2016/0021789 | A1* | 1/2016 | Negishi | H01L 23/42 361/714 |
| 2016/0079138 | A1* | 3/2016 | Uzoh | H01L 23/3142 257/692 |
| 2017/0012016 | A1* | 1/2017 | Joshi | H01L 23/00 |
| 2017/0047264 | A1* | 2/2017 | Im | H01L 21/563 |
| 2017/0110389 | A1* | 4/2017 | Hayashi | H01L 23/3114 |
| 2017/0271229 | A1* | 9/2017 | Santos | H01L 33/62 |
| 2017/0287805 | A1* | 10/2017 | Ozawa | H01L 23/3114 |
| 2017/0323844 | A1* | 11/2017 | Karlicek, Jr. | H01L 23/42 |
| 2018/0012865 | A1* | 1/2018 | Schrock | H01L 23/4334 |
| 2018/0054920 | A1* | 2/2018 | Hung | H01L 23/3675 |
| 2018/0076107 | A1* | 3/2018 | Kishi | H01L 23/13 |
| 2018/0228065 | A1* | 8/2018 | Wrona | H05K 7/20918 |
| 2018/0261528 | A1* | 9/2018 | Chen | H01L 23/16 |
| 2019/0043771 | A1* | 2/2019 | Chang | H01L 23/04 |
| 2019/0043778 | A1* | 2/2019 | Tang | H01L 25/0655 |
| 2019/0088569 | A1* | 3/2019 | Sawanaka | H01L 23/5383 |
| 2019/0103335 | A1* | 4/2019 | Mizuno | H01L 23/5386 |
| 2019/0172816 | A1* | 6/2019 | Kim | H01L 23/3675 |
| 2019/0206757 | A1* | 7/2019 | Hayashida | H01L 23/488 |
| 2019/0221498 | A1* | 7/2019 | Wu | H01L 21/56 |
| 2019/0237382 | A1* | 8/2019 | Kim | H01L 23/36 |
| 2019/0252300 | A1* | 8/2019 | Komo | H01L 23/13 |
| 2019/0348340 | A1* | 11/2019 | Kwon | H01L 23/3128 |
| 2020/0024496 | A1* | 1/2020 | Murakami | C09J 133/00 |
| 2020/0098661 | A1* | 3/2020 | Lofgreen | H01L 23/367 |
| 2020/0149829 | A1* | 5/2020 | Watanabe | F28F 21/084 |
| 2020/0152540 | A1* | 5/2020 | Nah | H01L 25/0655 |
| 2020/0185301 | A1* | 6/2020 | Stoek | H01L 23/3736 |
| 2020/0194542 | A1* | 6/2020 | Alapati | H01L 23/49827 |
| 2020/0381332 | A1* | 12/2020 | Saha | H01L 23/3675 |
| 2020/0388554 | A1* | 12/2020 | Falola | H01L 23/42 |

FOREIGN PATENT DOCUMENTS

| | | | | |
|---|---|---|---|---|
| JP | | 55116295 U | * 8/1980 | |
| WO | WO-2015111242 A1 | * | 7/2015 | H01L 23/36 |
| WO | WO-2015146917 A1 | * | 10/2015 | H01L 21/4878 |
| WO | WO-2015183884 A2 | * | 12/2015 | H01L 23/04 |
| WO | WO-2017217328 A1 | * | 12/2017 | H01L 23/29 |
| WO | WO-2018026592 A1 | * | 2/2018 | H01L 21/52 |
| WO | WO-2019064873 A1 | * | 4/2019 | H02M 7/48 |
| WO | WO-2019116828 A1 | * | 6/2019 | H05K 7/20 |
| WO | WO-2020021777 A1 | * | 1/2020 | H01L 23/36 |

OTHER PUBLICATIONS

Machine translation, Otaki, WIPO Pat. Pub. No. 2015-146917, translation date: Aug. 31, 2020, Espacenet, all pages (Year: 2020).*

* cited by examiner

FIG. 2A"

ELECTRONIC PACKAGE, METHOD FOR FABRICATING THE SAME, AND HEAT DISSIPATOR

This Application claims priority from Application 108110299 filed on Mar. 25, 2019 in Taiwan. This Application claims priority from Application 107141676 filed on Nov. 22, 2018 in Taiwan. The entire contents of these applications are incorporated herein by reference in their entirety.

BACKGROUND

1. Technical Field

The present disclosure relates to package structures, and, more particularly, to an electronic package having a heat dissipator and a method for fabricating the electronic package.

2. Description of the Prior Art

As the demand for electronic products in terms of function and processing speed increases, semiconductor chips, which are the core components of electronic products, need to have higher density electronic components and electronic circuits. As a result, the semiconductor chip will generate a larger amount of heat during operation. Since the conventional encapsulant covering the semiconductor chip is a poor heat transfer material having a thermal conductivity of only 0.8 Wm-1k-1 (that is, the heat dissipation efficiency is poor), if the heat generated by the semiconductor chip cannot be effectively dissipated, the semiconductor chip will likely be damaged and product reliability issues occur.
In order to dissipate heat quickly, a heat sink or a heat spreader is generally installed in a semiconductor package. In general, the heat sink is bonded via a heat-dissipating resin, such as a thermal interface material (TIM), to a rear surface of a chip, and heat generated by the semiconductor chip can be dissipated via the heat-dissipating resin and heat sink. In general, the top surface of the heat sink is exposed from the encapsulant or to the ambient, in order to obtain a better heat-dissipating effect.

As shown in FIG. 1, a method for fabricating a semiconductor package 1 according to the prior art is shown. A semiconductor chip 11 is disposed on a packaging substrate 10 in a flip-chip manner (i.e. via conductive bumps 110 and an under-fill 111) with its active surface 11a bonded to the packaging substrate 10. The top surface 130 of a heat dissipator 13 is reflowed and bonded to an inactive surface 11b of the semiconductor chip 11 via a TIM layer 12 (including a solder tin layer and flux). A supporting leg 131 of the heat dissipator 13 is disposed on the packaging substrate 10 via an adhesive layer 14. A packaging and molding process is then performed, for an encapsulant (not shown) to encapsulate the semiconductor chip 11 and the heat dissipator 13, with the top surface 130 of the heat dissipator 13 exposed from the encapsulant.

In operation, the semiconductor chip 11 generates heat, which will be transferred via the inactive surface 11b, the TIM layer 12 and the top surface 130 of the heat dissipator 13 to a region outside of the semiconductor package 1.

However, in the semiconductor package 1 according to the prior art, the top surface 130 of the heat dissipator 13 is planar, causing the heat dissipator 13 to have a limited heat-dissipating area and a limited heat-dissipating effect, which cannot satisfy the high heat-dissipating requirement for the semiconductor package 1.

In the fabricating process of the semiconductor package 1 according to the prior art, the adhesive layer 14, after being heated and glued to the packaging substrate 10, is adhered to the supporting leg 131 of the heat dissipator 13 directly. An adhesion force will be generated after the adhesive layer 14 is cooled, and the packaging substrate 10 can be adhered to the heat dissipator 13. However, bubbles are likely formed in the adhesive layer 14 during the heating process. Therefore, the adhesive layer 14 has a weak structure, and the heat dissipator 13 is likely to fall off.

When the semiconductor package 1 is thinned but still requires more area, the deformation (i.e., warpage) between the heat dissipator 13 and the TIM layer 12 due to the CTE mismatch is more apparent. When the deformation is too much, the top surface 130 of the heat dissipator 13 is likely delaminated from the TIM layer 12 (or the semiconductor chip 11). Therefore, the heat conduction effect is degraded, the semiconductor package 1 does not have a good appearance, and the reliability of the product is affected.

Therefore, how to overcome the problems of the prior art is becoming an urgent issue in the art.

SUMMARY

In view of the problems of the prior art, the present disclosure provides an electronic package, comprising: a carrier; at least one electronic component disposed on the carrier; and a heat dissipator comprising: a heat dissipating body bonded to the electronic component via a thermal interface layer and formed with a concave-convex structure having a plurality of convex portions and a plurality of concave portions, each of which is between any adjacent two of the convex portions; and a supporting leg disposed on the heat dissipating body, bonded to the carrier, and supporting the heat dissipating body.

The present disclosure further provides a method for fabricating an electronic package, comprising: providing a heat dissipator, comprising: a heat dissipating body formed with a concave-convex structure having a plurality of convex portions and a plurality of concave portions, each of which is between any adjacent two of the convex portions; and a supporting leg disposed on the heat dissipating body; and bonding the heat dissipator to a carrier having at least one electronic component disposed thereon, with the supporting leg being bonded to the carrier and the heat dissipating body being bonded via a thermal interface layer to the electronic component.

In an embodiment, the method further comprises controlling, by a positioning device, a thickness of the electronic package.

In an embodiment, the method further comprises performing an air extracting process while the heat dissipator is bonded to the carrier.

In an embodiment, at least one of the convex portions is ridge-shaped, and the at least one of the convex portions has at a bottom thereof a first lateral side and a second lateral side opposing the first lateral side and differing from the first lateral side in width. In another embodiment, the convex portions are arranged in a manner that the first lateral sides and the second lateral sides are interleaved.

In an embodiment, the heat dissipating body is defined with a first section formed with the concave-convex structure and a second section being adjacent to the first section and formed with a wall structure disposed between the supporting leg and the concave-convex structure. In another embodiment, the wall structure is bonded via a bonding material to the electronic component, and the bonding material extends to the concave-convex structure and is in contact with the thermal interface layer. In yet another embodiment, the second section of the heat dissipating body, the carrier, the electronic component and the supporting leg form an air space. In still another embodiment, the concave portions are formed with an air chamber less than the air space in air pressure.

In an embodiment, an air chamber is formed between the thermal interface layer and the concave portions.

In an embodiment, the thermal interface layer has a complementary shape to the concave-convex structure.

In an embodiment, the heat dissipating body is defined with a first section formed with the concave-convex structure and a second section being adjacent to the first section and bonded via the thermal interface layer to the electronic component and the carrier.

In an embodiment, roughness of at least one surface of the heat dissipating body is greater than 1.5 mm to form the concave-convex structure.

In an embodiment, at least one of the convex portions of the concave-convex structure is a rib or a bump.

In an embodiment, at least one of the concave portions of the concave-convex structure is a groove or a recess.

The present disclosure still provides a heat dissipator, comprising: a heat dissipating body formed with a concave-convex structure having a plurality of convex portions and a plurality of concave portions, each of which is between any adjacent two of the convex portions; and at least one supporting leg disposed on the heat dissipating body.

In an embodiment, at least one of the convex portions is ridge-shaped. In another embodiment, the at least one of the convex portions has at a bottom thereof a first lateral side and a second lateral side opposite to the first lateral side and greater than the first lateral side in width. In yet another embodiment, the convex portions are arranged in a manner that the first lateral sides and the second lateral sides are interleaved.

In an embodiment, the heat dissipating body is defined with a first section formed with the concave-convex structure and a second section being adjacent to the first section and formed with a wall structure disposed between the supporting leg and the concave-convex structure.

In an embodiment, roughness of at least one surface of the heat dissipating body is greater than 1.5 mm to form the concave-convex structure.

In another embodiment, at least one of the convex portions of the concave-convex structure is a rib or a bump.

In yet another embodiment, at least one of the concave portions of the concave-convex structure is a groove or a recess.

It is known from the above that in the electronic package, the method for fabricating the same and the heat dissipator according to the present disclosure, the design of the concave-convex structure increases a heat-dissipating area of the heat dissipating body.

Therefore, compared with the prior art, the heat dissipator according to the present disclosure has a better heat-dissipating effect and can satisfy the high heat-dissipating requirement for the electronic package.

According to the present disclosure, an air extracting device performs an air extracting process. As a result, bubbles are not likely to be formed in the bonding material during a heating process. Therefore, compared with the prior art, the bonding material according to the present disclosure has a stronger structure, and the heat dissipator is unlikely to fall off.

According to the present disclosure, the convex portions are interleaved, and a heat stress can be distributed evenly and will not be focused on one side of the heat dissipating body. Therefore, the method according to the present disclosure can control the deformation (warpage) of the heat dissipating body, and prevent the heat dissipating body from being delaminated from the thermal interface layer.

According to the present disclosure, the design of the air chamber can generate an absorption force, and the heat dissipator can be fixed to the carrier securely.

BRIEF DESCRIPTION OF THE DRAWINGS

The disclosure can be more fully understood by reading the following detailed description of the embodiments, with reference made to the accompanying drawings, wherein:

FIG. 2A' is a locally schematic diagram of FIG. 2A;

FIG. 2A" is a locally enlarged view of FIG. 2A';

FIG. 2C' is a schematic diagram of equipment arrangement applied to the process of FIG. 2C;

FIG. 2D' is a locally schematic diagram of FIG. 2D;

FIGS. 6A-1 to 6A-7 are locally perspective views of another embodiment of a concave-convex structure according to the present disclosure;

FIGS. 6B-1 to 6B-4 are locally perspective views of another embodiment of a concave-convex structure according to the present disclosure;

FIGS. 6C-1 to 6C-4 are locally perspective views of another embodiment of a concave-convex structure according to the present disclosure; and FIG. 7 is a locally perspective view of another embodiment of a concave-convex structure according to the present disclosure.

DETAILED DESCRIPTION

The following illustrative embodiments are provided to illustrate the disclosure of the present disclosure, these and other advantages and effects can be apparently understood by those in the art after reading the disclosure of this specification.

It should be appreciated that the structures, proportions, size and the like of the figures in the present application are intended to be used in conjunction with the disclosure of the specification. They are not intended to limit the disclosure and therefore do not represent any substantial technical meanings. The details of the specification may be on the basis of different points and applications, and numerous modifications and variations can be devised without departing from the spirit of the present disclosure. As used herein, the terms "over," "first," "second," "a" and the like, are used to distinguish one element from another, and are not intended to limit the scope of the present application. Changes or adjustments are considered to be within the scope of the present disclosure, without departing from the scope of the present disclosure.

FIGS. 2A to 2D are cross-sectional views illustrating a method for fabricating an electronic package 2 according to the present disclosure.

Figure 1:
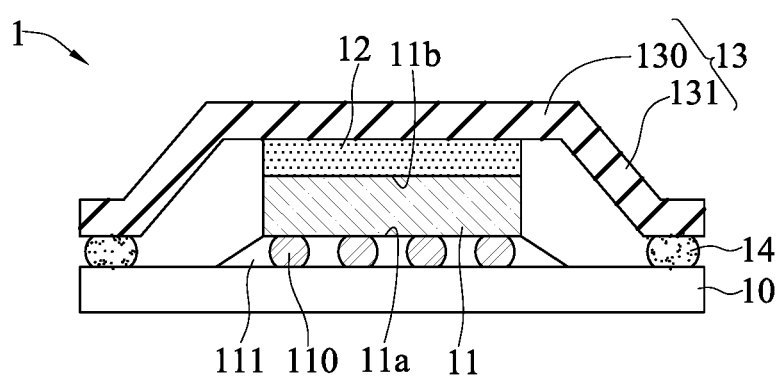
FIG. 1 is a cross-sectional view of a semiconductor package according to the prior art.
Figure 2A:
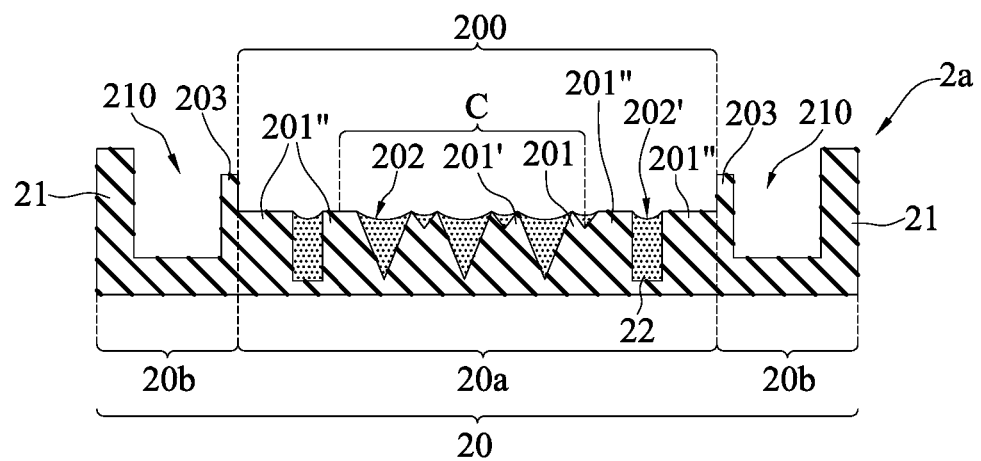
FIGS. 2A to 2D are cross-sectional views illustrating a method for fabricating an electronic package according to the present disclosure.
Figure 2A:
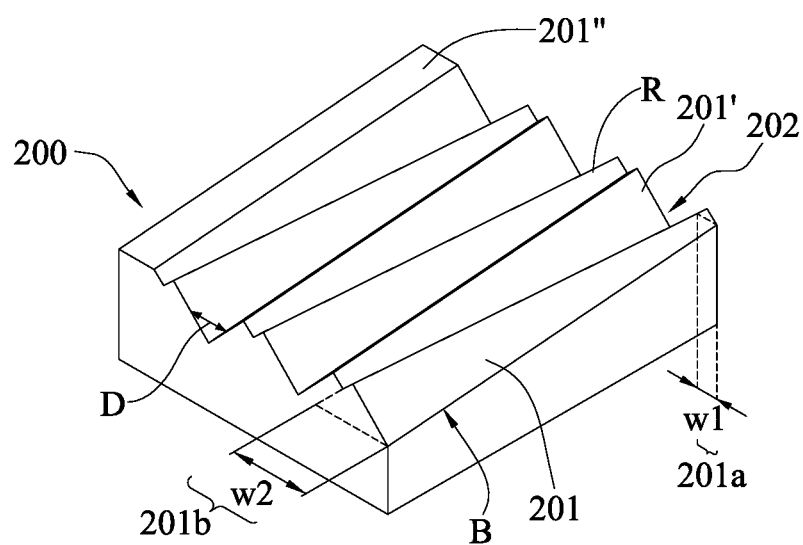

As shown in FIGS. 2A and 2A', a heat dissipator 2a is provided, comprising a heat dissipating body 20 and at least one supporting leg 21 disposed on the heat dissipating body 20. A concave-convex structure 200 is disposed on a surface of the heat dissipating body 20 and comprises a plurality of convex portions 201, 201', 201" and a plurality of concave portions 202, 202' disposed among the convex portions 201, 201'. At least one of the convex portions 201, 201' is ridge-shaped (at least one of the concave portions 202 is groove-shaped). At least one of the convex portions 201" is in the shaped of a fin or a rectangular sheet, to form the concave portions 202, 202' of different shapes correspondingly. A thermal interface layer 22 is formed on the heat dissipating body 20.

In an embodiment, the heat dissipating body 20 is defined with a first section 20a and a second section 20b adjacent to the first section 20a. The first section 20a is formed with the concave-convex structure 200. The second section 20b is formed with the supporting leg 21 and at least one wall structure 203 disposed between the supporting leg 21 and the concave-convex structure 200. A recess 210 is formed between the supporting leg 21 and the wall structure 203. The wall structure 203 is greater than the convex portions 201, 201', 201" in height, and a stair is formed between adjacent wall structure 203 and convex portions 201".

The concave portions 202, 202' has a minimum width D less than 1 mm. Each of the ridge-shaped convex portions 201, 201' has on a top side thereof a tip R having a width W less than 3 mm (as shown in FIG. 2A"). Each of the ridge-shaped convex portions 201, 201' has on a bottom side B thereof a first lateral side (short lateral side) 201a and a second lateral side (long lateral side) 201b opposing the first lateral side 201a. The first lateral side 201a has a width w1 less than a width w2 of the second lateral side 201b. In an embodiment, the bottom side B is cone-shaped (as the shape of a portion C of the first section 20a of FIG. 2A shown in FIG. 2A')

At least two of the ridge-shaped convex portions 201, 201' are reversely arranged with respect to the first lateral side 201a and the second lateral side 201b on the bottom side B, i.e., the ridge-shaped convex portions 201, 201' being interleaved with one of the at least two having its short lateral side (the first lateral side 201a) adjacent to the long lateral side (the second lateral side 201b) of the other, as shown in FIG. 2A'.

The thermal interface layer 22 is TIM, such as a heat conducting material melt at a low temperature, can be formed by solid or liquid metal (e.g., a solder tin material), and is filled in the concave portions 202 and 202'.

Figure 2B:
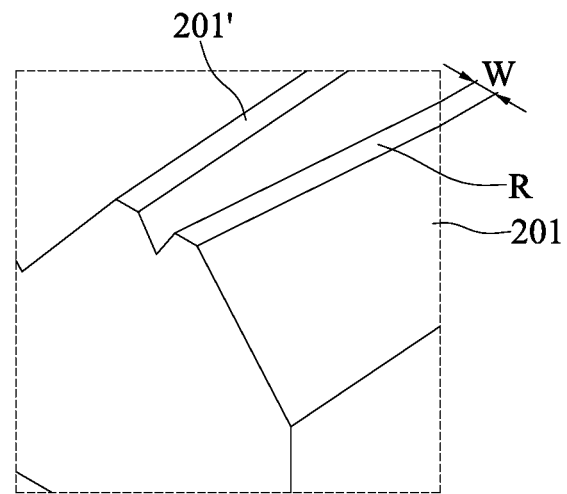
Figure 2B:
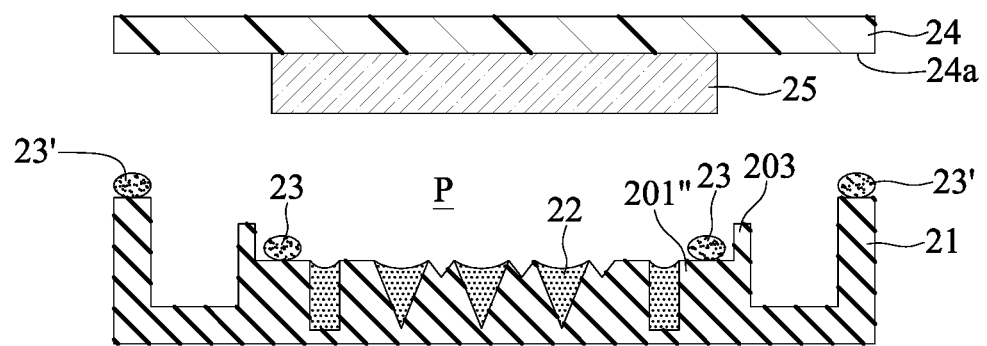

As shown in FIG. 2B, a bonding material 23, 23' is formed on the sheet-shaped convex portions 201" and the supporting leg 21. A carrier 24 having a chip mounting side 24a disposed with at least one electronic component 25 is provided.

In an embodiment, the carrier 24 is a substrate having a core layer and a circuit structure or a coreless circuit structure. A circuit layer is formed on a dielectric material, such as a fan out redistribution layer (RDL). In another embodiment, the carrier 24 can be a carrying structure, such as a leadframe or a silicon interposer, that can carry an electronic component, such as a chip.

In an embodiment, the electronic component 25 is an active component, such as a semiconductor chip, a passive component, such as a resistor, a capacitor and an inductor, or a combination thereof. In another embodiment, the electronic component 25 is electrically connected to the circuit layer of the carrier 24 in a flip-chip or wiring manner. However, the electronic component 25 can be electrically connected to the carrier 24 in other manners.

In an embodiment, the bonding material 23, 23' is a resin material, an adhesive material or a metal material, and has a different material from the thermal interface layer 22.

Figure 2C:
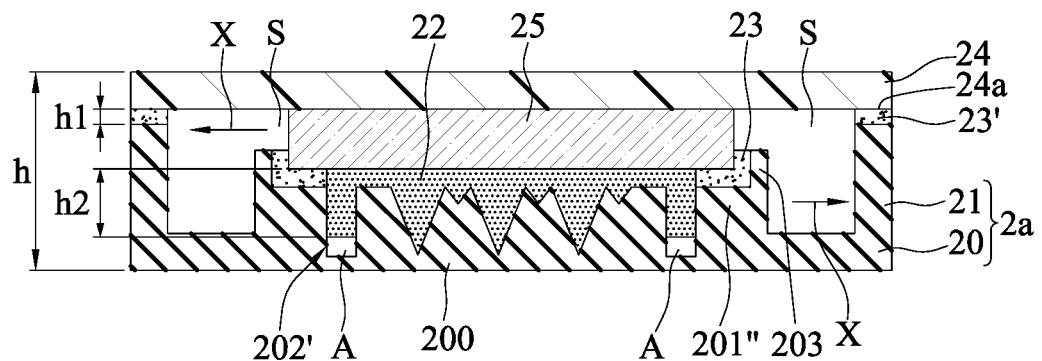
Figure 2C:
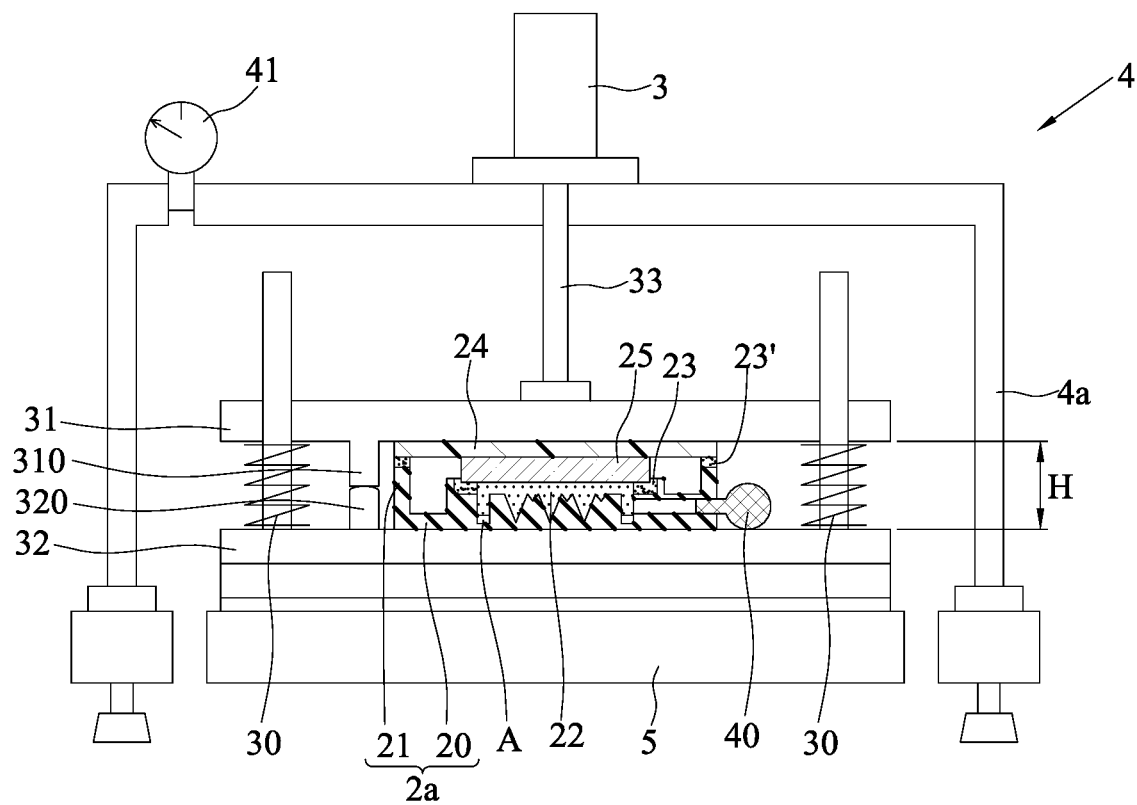

As shown in FIG. 2C, the supporting leg 21 of the heat dissipator 2a is bonded via the bonding material 23' to the chip mounting side 24a of the carrier 24, the wall structure 203 and the sheet-shaped convex portions 201" are bonded via the bonding material 23 to the electronic component 25, and the heat dissipating body 20 is bonded via the thermal interface layer 22 to the electronic component 25.

In an embodiment, a portion of the concave portions 202' is not fully filled with the thermal interface layer 22, to form an air chamber A in the concave portions 202'. In an embodiment, the air chamber A has a volume greater than or equal to the expansion of the thermal interface layer 22 at a predetermined temperature (e.g., 260° C.). In the method according to the present disclosure, the temperature is between 25° C. and 240° C., and the volume of the air chamber A has to be greater than the expansion of the thermal interface layer 22 at 240° C., or the thermal interface layer 22 will fill the concave portions 202' fully to vanish the air chamber A.

As shown in FIG. 2C', the heat dissipator 2a can be bonded to the carrier 24 by a positioning device 3 and an air extracting device 4. In an embodiment, the heat dissipator 2a can be compressed by the positioning device 3 onto the carrier 24 and the electronic component 25, and the air extracting device 4 may perform an air extracting process (e.g., a vacuuming process with a vacuum value approximately equal to $1\text{-}10^7$ mm Hg) before the heat dissipator 2a is compressed onto the carrier 24 and the electronic component 25.

In an embodiment, when the heat dissipator 2a is compressed onto the carrier 24 and the electronic component 25, the positioning device 3, by using a driving member 33 connecting a first compressing plate 31, compresses and moves the first compressing plate 31 downward; an elastic member 30, such as a spring, buffers the displacement of the first compressing plate 31 with respect to the second compressing plate 32 to prop a first positioning portion 310 of the first compressing plate 31 against a second positioning portion 320 of the second compressing plate 32 and control a distance H between the first compressing plate 31 and the second compressing plate 32; the carrier 24 disposed on the first compressing plate 31 will position with respect to the heat dissipator 2a disposed on the second compressing plate 32 to control a thickness h1 of the bonding material 23' of the supporting leg 21 and a thickness h2 of the thermal interface layer 22, i.e., the distance H equaling to a sum h of thicknesses of the carrier 24, the bonding material 23' and the heat dissipator 2a; and after the compressing process, the wall structure 203 and a bonding material 23 at a portion of the convex portions 201" are in contact with the thermal interface layer 22, and the second section 20b of the heat dissipating body 20, the carrier 24, the electronic component 25 and the supporting leg 21 will form an air space S.

When the carrier 24 and the heat dissipator 2a are positioning to each other, an outer mask 4a of the air extracting device 4 covers the positioning device 3 first; at least one pipe 40 of the air extracting device 4 is inserted into a region between the carrier 24 and the heat dissipator 2a; a pipe 41 is in communication with an internal region of the outer mask 4a and the air extracting process is performed to form the air chamber A; and air in an interval space P (as shown in FIG. 2B) between the electronic component 25 and the heat dissipator 2a is extracted to reduce the air pressure between the electronic component 25 and the concave-convex structure 200 to be less than one atmosphere. After the compressing process, the air chamber A has an air pressure different than (e.g., less than) that of the air space S. In an embodiment, the air pressure of the air chamber A is approximately $1\text{-}10^{-7}$ mm Hg, and the air pressure of the air space S is approximately greater than 760 mm Hg (i.e., one atmosphere), so as to generate an absorption force due to the air pressure difference. Therefore, the heat dissipator 2a and the carrier 24 can be bonded to each other in such an air absorption manner, and the bonding force between the heat dissipator 2a and the carrier 24 is increased.

The air extracting device 4 can cooperate with the positioning device 3 (i.e., the first compressing plate 31 is compressed on one hand, and the air between the electronic component 25 and the concave-convex structure 200 is extracted on the other hand). Therefore, the air extracting device 4 can provide air to the driving member 33 of the positioning device 3, allowing the driving member 33 to be connected to the first compressing plate 31 in an absorption manner.

After the air extracting process (extracting oxygen and volatile solvent) is performed, a heating device 5 performs a heating process via the second compressing plate 32 to cure the thermal interface layer 22 evenly and securely, without forming bubbles in the thermal interface layer 22. Therefore, the adhesion is increased, the thermal resistance of the thermal interface layer 22 is reduced, and the heat conducting rate of the thermal interface layer 22 is increased. During the heating process, the solvent of the bonding material 23, 23' is likely volatile outward (as indicated by an arrow direction X), and no bubbles will be formed in the bonding material 23, 23'.

Since the air pressure between the electronic component 25 and the concave-convex structure 200 is less than one atmosphere after the compressing process is performed, the thermal energy and air flow provided by the heating device 5 will not generate a thermal convection effect at the interval space P. Therefore, the heating device 5 can provide even thermal energy to the thermal interface layer 22, to prevent the uneven temperature at which the thermal interface layer 22 is cured from occurring.

In an embodiment, the heating device 5, the air extracting device 4 and the positioning device 3 can be integrated into a machine, to achieve the automation requirement.

Figure 2D:
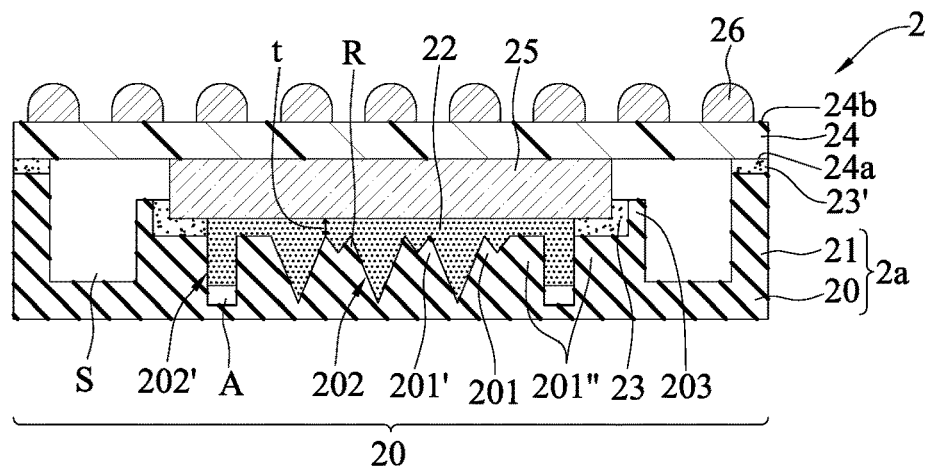
Figure 2D:
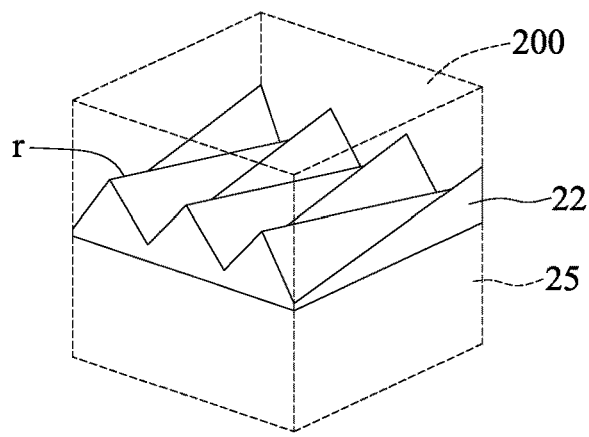

As shown in FIG. 2D, a plurality of conductive elements 26 are disposed on a ball planting side 24b of the carrier 24.

In an embodiment, the conductive elements 26 can be, but not limited to a metal bump, such as a copper bump, a solder tin bump or a tin ball having a copper core.

Figure 3A:
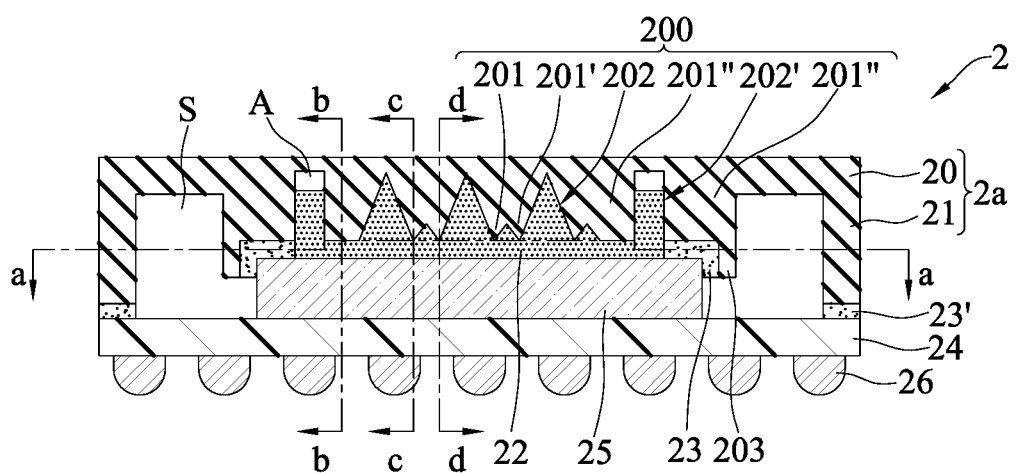
FIG. 3A is a cross-sectional view of an electronic package according to the present disclosure.
Figure 3B:
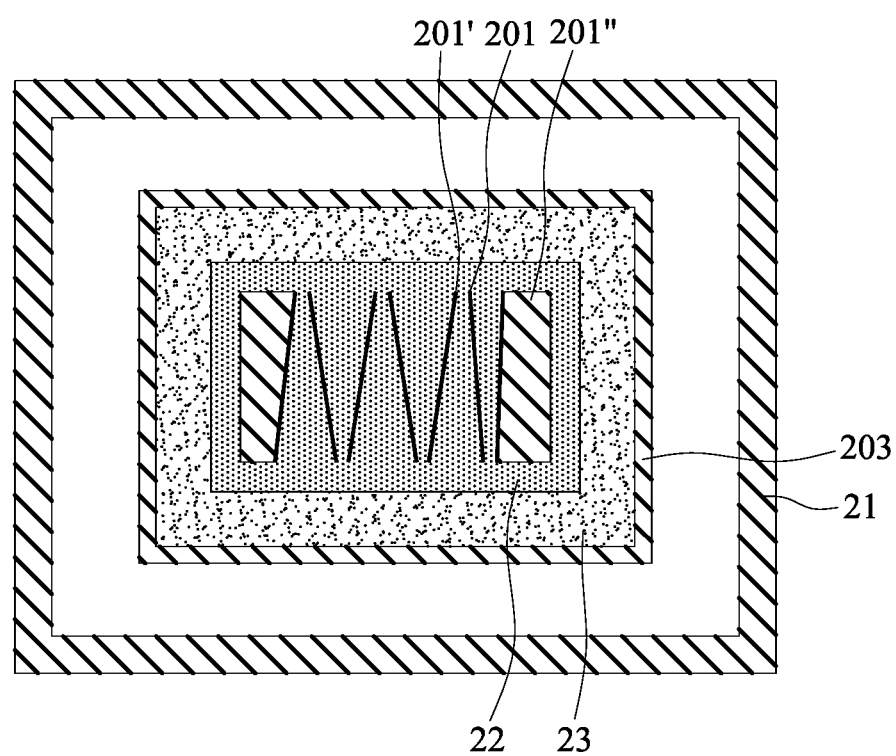
FIG. 3B is a cross-sectional view of FIG. 3A along a line a-a.
Figure 3C:
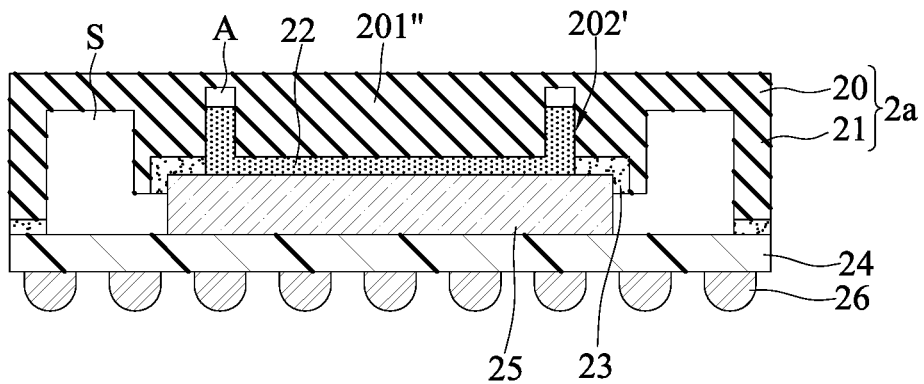
FIG. 3C is a cross-sectional view of FIG. 3A along a line b-b.
Figure 3D:
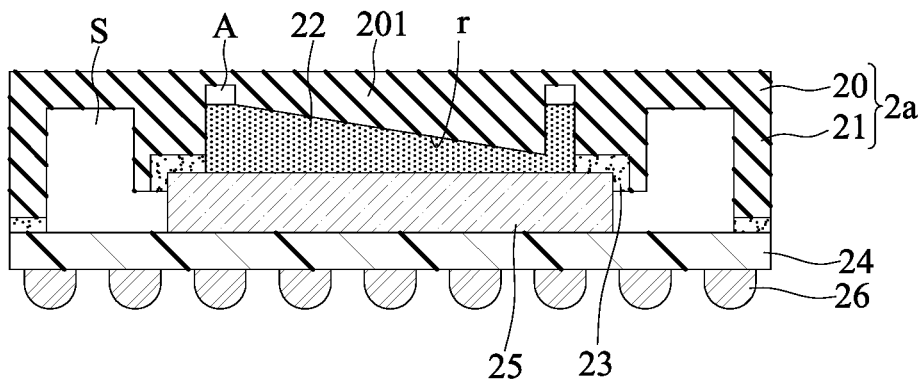
FIG. 3D is a cross-sectional view of FIG. 3A along a line c-c.
Figure 3E:
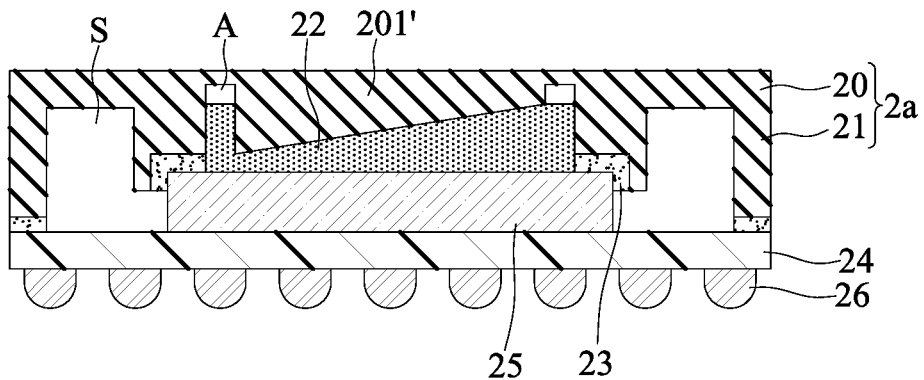
FIG. 3E is a cross-sectional view of FIG. 3A along a line d-d.

An interval t between the electronic component 25 and the tips R of the ridge-shaped convex portions 201, 201' of the heat dissipating body 20 is at most 1 mm. The thermal interface layer 22 has a complementary shape to the concave-convex structure 200 (as the mountain shape shown in FIG. 2D'), and the thermal interface layer 22 is formed with a ridge portion having the tips r. The tips r of the thermal interface layer 22 (or the tips R of the ridge-shaped convex portions 201, 201') lean toward one side, as shown in the cross-sectional view of FIG. 3D or 3E.

Figure 2E:
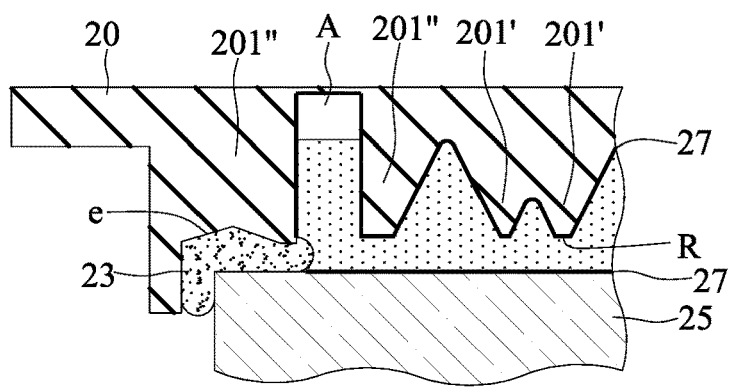
FIG. 2E is a locally schematic diagram of another embodiment of the method of FIG. 2D.
Figure 4A:
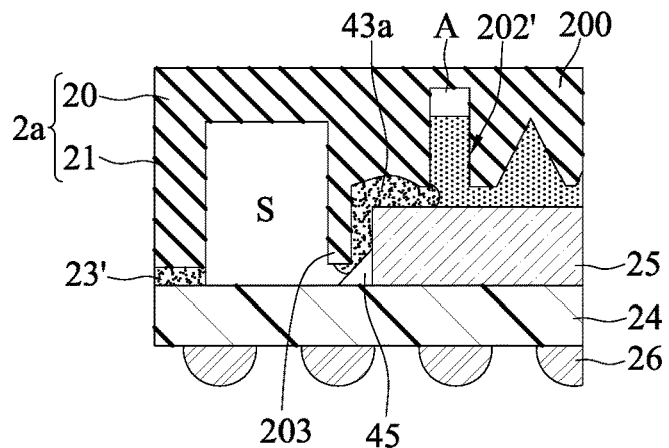
FIGS. 4A to 4E are locally cross-sectional views of another embodiment of FIG. 3A according to the present disclosure.
Figure 4B:
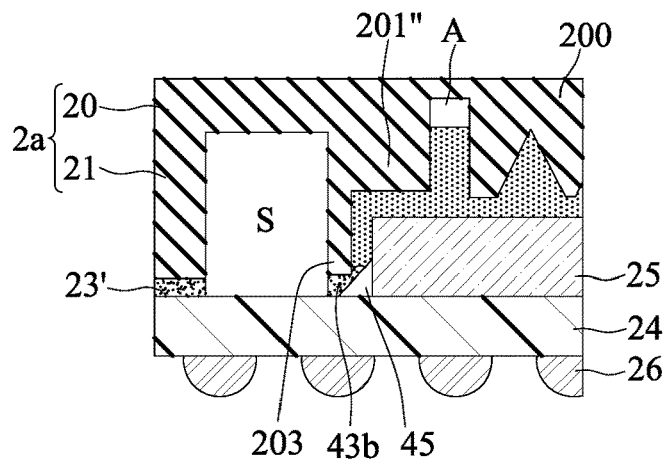
Figure 4C:
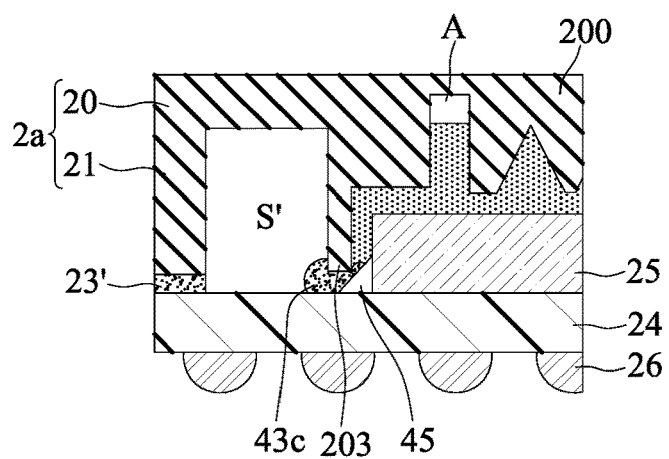
Figure 4D:
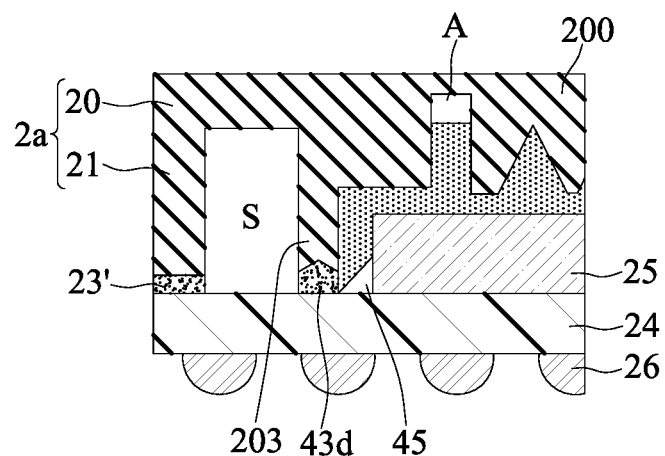

The bonding material 23 at the stair is L-shaped to increase the bonding effect of the bonding material 23. The air pressure difference between an internal side and an external side of the bonding material 23 (the air pressure of the air chamber A is less than the air pressure of the air space S), i.e., an absorption force, further bonds the heat dissipator 2a to the carrier 24 securely. In an embodiment, the sheet-shaped convex portions 201" are formed on top sides thereof with V-shaped concave surfaces e, as shown in FIG. 2E, to increase the contact surface of the bonding material 23 and improve the bonding effect of the bonding material 23. The end surface of the wall structure 203 may also be a concave surface (as shown in FIG. 4D), or the end surface of the supporting leg 21 may also be a concave surface (not shown).

In order to increase the bonding strength between thermal interface layer 22 (TIM) and the electronic component 25, gold can be coated on the electronic component 25 (i.e., the so-called Coating Gold On Chip Back). As shown in FIG. 2E, a gold layer 27 is formed on a surface of the electronic component 25 and on a surface of the heat dissipating body 20, and flux is used to bond the thermal interface layer 22 to the gold layer 27.

Please refer to cross-sectional views of FIGS. 3A and 3B to 3E in different directions of an electronic package 2 fabricated by a method according to the present disclosure. According to the present disclosure, the design of the heat dissipator 2a having the concave-convex structure 200 can increase the heat-dissipating area of the heat dissipating body 20. Compared with the prior art, the heat dissipator 2a according to the present disclosure has a better heat-dissipating effect and can satisfy the high heat-dissipating requirement for the electronic package 2. The thermal interface layer 22 has a complementary shape to the concave-convex structure 200. The tips r of the thermal interface layer 22 are easily thermally saturated due to their small volume (or thermal capacity), and the heat at the tips r of the thermal interface layer 22 is easily conducted to the heat dissipating body 20 (e.g., the bottom side B of the convex portions 201, 201' or the bottom side of the concave portions 202). Since having a greater thermal capacity, the heat dissipating body 20 can conduct heat to an external environment quickly.

In a method according to the present disclosure, the air extracting device 4 performs an air extracting process first; and a heating process is then performed. The solvent of the bonding material 23, 23' is likely to be volatile outward during the heating process, and no bubbles will be likely formed between the bonding material 23, 23' and the thermal interface layer 22. Compared with the prior art, the bonding material 23,23' and the thermal interface layer 22 have a stronger structure, and the heat dissipator 2a is unlikely to fall off.

According to the method of the present disclosure, the long and short lateral sides of the convex portions 201, 201' are interleaved, and the thermal stress can be distributed evenly and will not be focused on one side of the bottom side B of the convex portions 201, 201'. Therefore, the method according to the present disclosure can control the deformation (warpage) of the heat dissipating body 20 effectively, and prevent the heat dissipating body 20 from being laminated from the thermal interface layer 22. Therefore, the thermal conduction effect is improved, and the appearance of the electronic package 2 will not be affected. If the long lateral sides of the bottom side B of adjacent convex portions 201, 201' are aligned with each other, the heat dissipating body 20 may have too much the deformation.

According to the method of the present disclosure, the air pressure of the air chamber A is less than the air pressure of the air space S, and an absorption force is thus generated. Therefore, the heat dissipator 2a can be bonded to the carrier 24 more securely.

In another embodiment, the bonding material 23 can be disposed at any region on demands. As shown in FIG. 4A, the bonding material 43a extends to the concave portions 202'. As shown in FIG. 4B, the bonding material 43b is in no contact with the convex portions 201''. As shown in FIG. 4C, the bonding material 43c extends into the air space S and changes the scope of the air space S' (or exceeding outward a vertical projection scope of the wall structure 203). As shown in FIG. 4D, the bonding material 43d is disposed within a vertical projection scope of the wall structure 203 only.

Figure 5A:
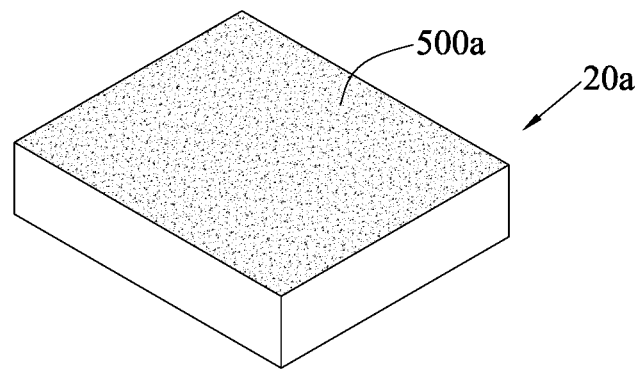
FIGS. 5A to 5C are locally perspective views of another embodiment of a concave-convex structure according to the present disclosure.
Figure 5B:
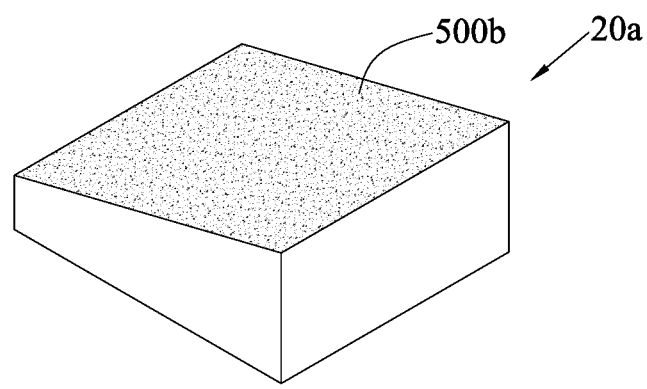
Figure 5C:
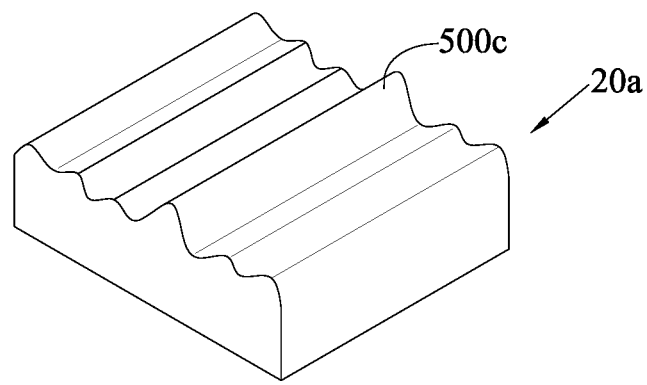

In another embodiment, the concave-convex structure of the first section 20a can be designed based on heat-dissipating demands. As shown in FIG. 5A, the first section 20a is a rectangular body. The surface of the rectangular body is roughed and has roughness Ra greater than 1.5 μm to form the concave-convex structure 500a. As shown in FIG. 5B, the first section 20a is a trapezoid body. The slant surface of the trapezoid body is roughed and have roughness Ra>1.5 μm to form the concave-convex structure 500b. As shown in FIG. 5C, the first section 20a is a rectangular body. The surface of the rectangular body is made concave and convex and is thus uneven, to act as the concave-convex structure 500c.

In addition to the roughing process, the concave-convex structure can also be designed to have sticks. As shown in FIGS. 6A-1, 6A-2, 6A-3, 6A-4, 6A-5, 6A-6 and 6A-7, the first section 20a is a rectangular body, and has on a heat dissipating surface thereof at least one (e.g., half round pipe, rectangular, triangular, curved, trapezoid or other shapes) groove, to form (e.g., half round pipe, rectangular, triangular, curved, trapezoid or other shapes) ribs, to act as the concave-convex structure 601a, 602a, 603a, 604a, 605a, 606a, 607a. Also shown in FIGS. 6B-1, 6B-2, 6B-3 and 6B-4, the first section 20a is a rectangular body, and at least one (e.g., round pillar, half ball, cone, rectangle or other shapes) bump is disposed on the heat-dissipating surface, to form the concave-convex structure 601b, 602b, 603b, 604b. Also as shown in FIGS. 6C-1, 6C-2, 6C-3 and 6C-4, the first section 20a is a rectangular body, and at least one (e.g., round hole, half ball hole, cone hole, rectangular hole or other shapes) recess is formed on the heat-dissipating surface, to form the concave-convex structure 601c, 602c, 603c, 604c.

Figures 1, 6A:
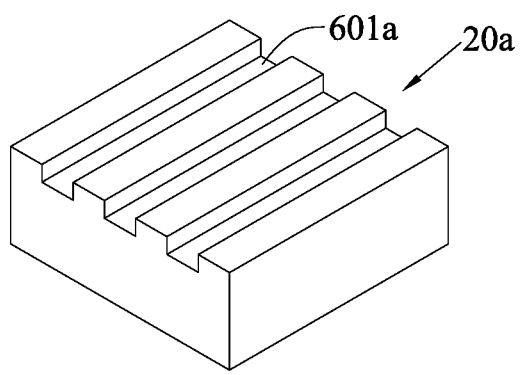
Figures 2, 6A:
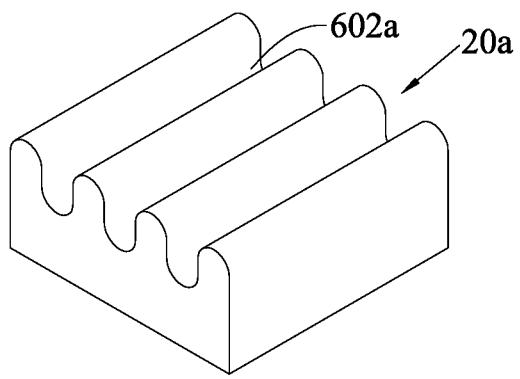
Figures 3, 6A:
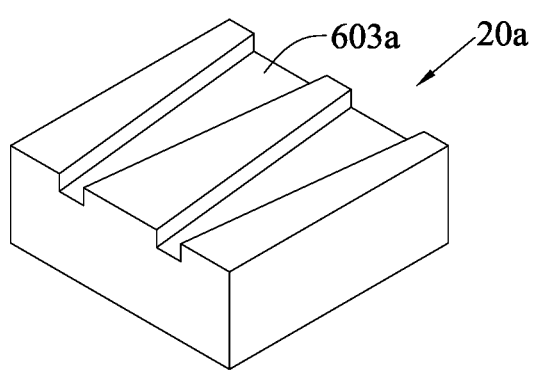
Figures 4, 6A:
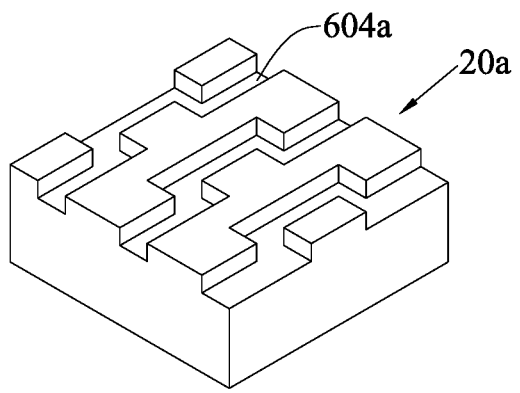
Figures 5, 6A:
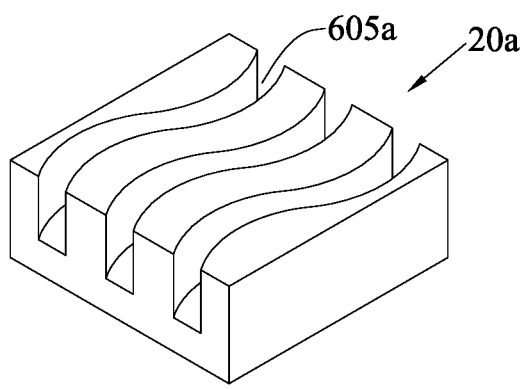
Figures 6, 6A:
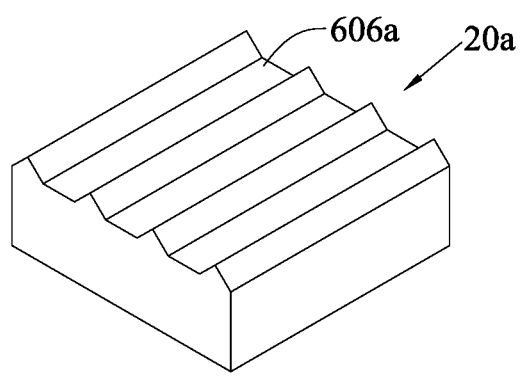
Figures 6, 6A, 7:
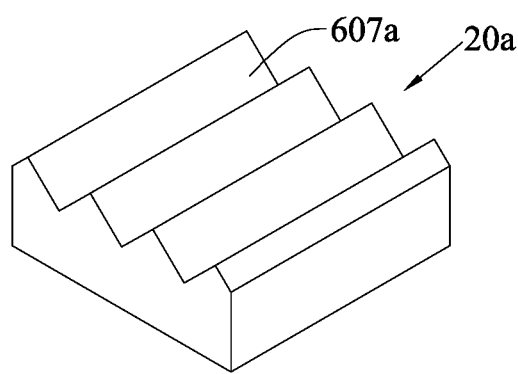
Figures 1, 6B:
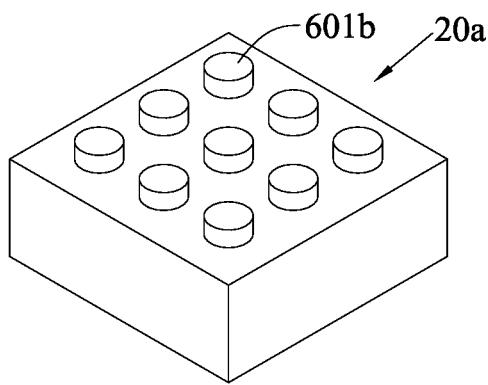
Figures 2, 6B:
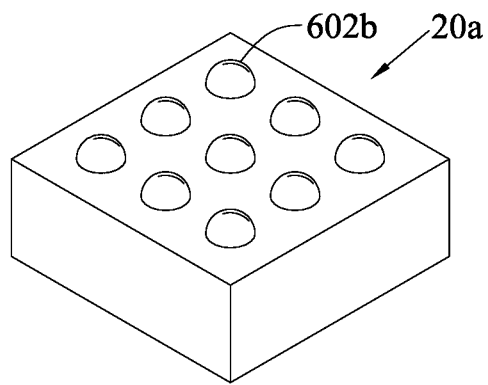
Figures 3, 6B:
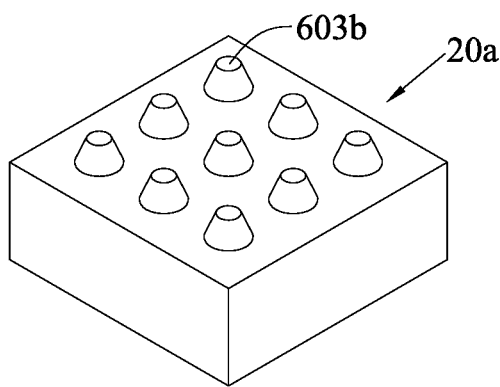
Figures 4, 6B:
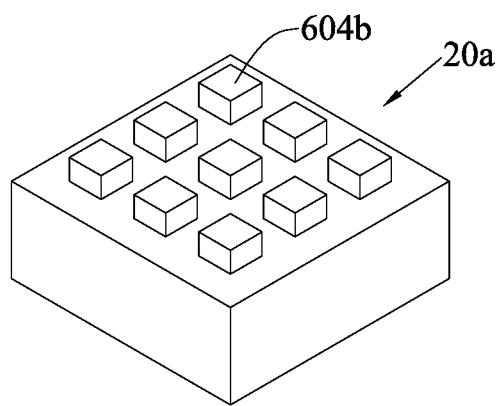
Figures 1, 6C:
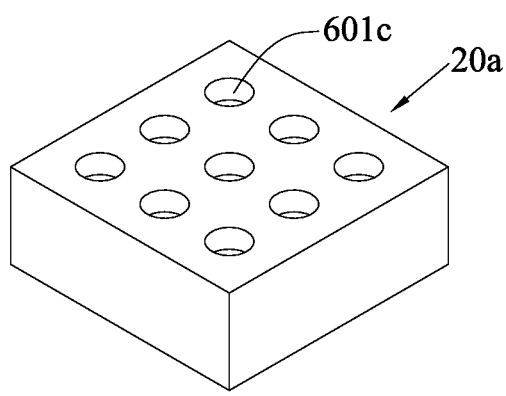
Figures 2, 6C:
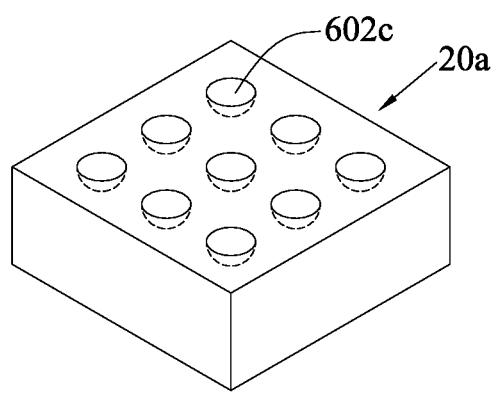
Figures 3, 6C:
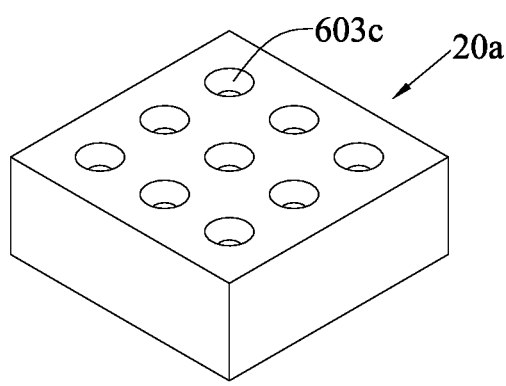
Figures 4, 6C:
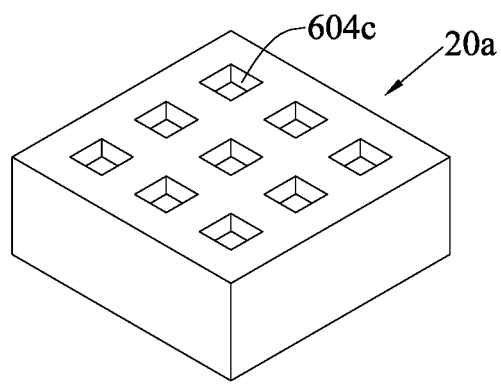
Figure 7:
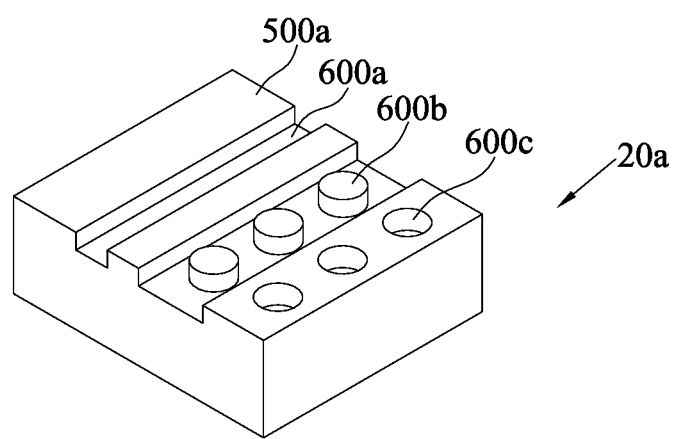

In an embodiment, the concave-convex structure can be roughed and have sticks, as shown in FIG. 7.

The present disclosure further provides an electronic package 2, comprising a carrier 24, an electronic component 25 disposed on the carrier 24, and a heat dissipator 2a bonded to the electronic component 25.

The heat dissipator 2a comprises a heat dissipating body 20 and at least one supporting leg 21 disposed on the heat dissipating body 20. The heat dissipating body 20 is bonded via a thermal interface layer 22 to the electronic component 25. The supporting leg 21 is bonded to the carrier 24 and supports the heat dissipating body 20. The heat dissipating body 20 is formed with a concave-convex structure 200 having a plurality of convex portions 201, 201', 201'' and a plurality of concave portions 202, 202' disposed among the convex portions 201, 201', 201''.

In an embodiment, a portion of the convex portions 201, 201' is ridge-shaped, and has on a bottom side B thereof a first lateral side 201a and a second lateral side 201b opposing the first lateral side 201a. The width w1 of the first lateral side (short lateral side) 201a is less than the width w2 of the second lateral side (long lateral side) 201b. In another embodiment, the long and short lateral sides of the convex portions 201, 201' are interleaved.

In an embodiment, the thermal interface layer 22 has a complementary shape to the concave-convex structure 200.

In an embodiment, the thermal interface layer 22 does not fill in the concave portions 202' fully in order to form an air chamber A in the concave portions 201''.

In an embodiment, the heat dissipating body 20 is defined with a first section 20a formed with the concave-convex structure 200 and a second section 20b being adjacent to the first section 20a and formed with a wall structure 203 disposed between the supporting leg 21 and the concave-convex structure 200.

In an embodiment, the wall structure 203 is bonded via a bonding material 23 to the electronic component 25, and the supporting leg 21 is bonded via a bonding material 23' to the carrier 24. In another embodiment, the bonding material 23 extends to the convex portions 201'' of the concave-convex structure 200, allowing the bonding material 23 to be in contact with the thermal interface layer 22.

In an embodiment, the second section 20b of the heat dissipating body 20 (including the wall structure 203 and the bonding material 23), the carrier 24, the electronic component 25 and the supporting leg 21 (including the bonding material 23') form an air space S, and the air pressure of the air chamber A is less than the air pressure of the air space S.

Figure 4E:
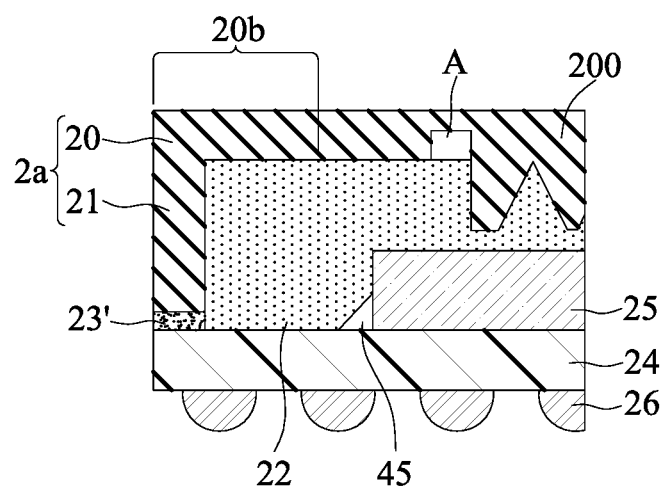

As shown in FIG. 4E, the second section 20b of the heat dissipating body 20 can be formed without the wall structure 203 and be bonded via the thermal interface layer 22 to the electronic component 25 and the carrier 24, and the air space S can be fully filled with the thermal interface layer 22 (i.e., no air space S), which does not fill the air chamber A fully.

As shown in FIGS. 4A to 4E, the electronic component 25 can be formed with an under-fill 45 therearound for a flip-chip process on demands.

In an embodiment, the roughness of at least one surface of the heat dissipating body 20 is greater than 1.5 μm to form the concave-convex structure 500a, 500b and 500c.

In an embodiment, the convex portions of the concave-convex structure 601a, 602a, 603a, 604a, 605a, 606a, 607a, 601b, 602b, 603b and 604b are ribs or bumps.

In an embodiment, the concave portions of the concave-convex structure 601a, 602a, 603a, 604a, 605a, 606a, 607a, 601c, 602c, 603c and 604c are grooves or recesses.

According to the electronic package and the method for fabricating the same of the present disclosure, with the heat dissipator having the concave-convex structure, the heat-dissipating area of the heat dissipating body is increased. Therefore, compared with the prior art, the heat dissipator of the present disclosure has a better heat-dissipating effect and can satisfy the high heat-dissipating requirement for the electronic package.

According to the present disclosure, the performance of the air extracting process prevents bubbles from being formed in the bonding material. Therefore, compared with the prior art, the bonding material of the present disclosure has a better bonding effect.

According to the present disclosure, the convex portions are interleaved, and the thermal stress can be distributed evenly. Therefore, the thermal stress will not be focused on the heat dissipating body and warpage occurrence will be prevented.

According to the present disclosure, an absorption force is generated due to the design of the air chamber. Therefore, the heat dissipator can be fixed more securely.

The foregoing descriptions of the detailed embodiments are only illustrated to disclose the features and functions of the present disclosure and not restrictive of the scope of the present disclosure. It should be understood to those in the art that all modifications and variations according to the spirit and principle in the disclosure of the present disclosure should fall within the scope of the appended claims.

What is claimed is:

1. An electronic package, comprising:
   a carrier;
   at least one electronic component disposed on the carrier; and
   a heat dissipator comprising:
      a heat dissipating body bonded to the electronic component via a thermal interface layer and formed with a concave-convex structure having a plurality of convex portions and a plurality of concave portions, each of the concave portions being between any adjacent two of the convex portions, wherein at least two of the convex portions are ridge-shaped; and
      a supporting leg disposed on the heat dissipating body, bonded to the carrier, and supporting the heat dissipating body,
      wherein the at least two of the convex portions each have, at a bottom thereof, a first lateral side and a second lateral side opposing the first lateral side and differing from the first lateral side in width, and
      wherein the convex portions are arranged in a manner that the first lateral sides and the second lateral sides are interleaved.

2. The electronic package of claim 1, wherein the heat dissipating body is defined with a first section formed with the concave-convex structure and a second section being adjacent to the first section and formed with a wall structure disposed between the supporting leg and the concave-convex structure.

3. The electronic package of claim 2, wherein the wall structure is bonded via a bonding material to the electronic component.

4. The electronic package of claim 3, wherein the bonding material further extends to the concave-convex structure.

5. The electronic package of claim 3, wherein the bonding material is in contact with the thermal interface layer.

6. The electronic package of claim 2, wherein the second section of the heat dissipating body, the carrier, the electronic component and the supporting leg form an air space.

7. The electronic package of claim 6, wherein the concave portions are formed with an air chamber less than the air space in air pressure.

8. The electronic package of claim 1, further comprising an air chamber formed between the thermal interface layer and the concave portions.

9. The electronic package of claim 1, wherein the thermal interface layer has a complementary shape to the concave-convex structure.

10. The electronic package of claim 1, wherein the heat dissipating body is defined with a first section formed with the concave-convex structure and a second section being adjacent to the first section and bonded via the thermal interface layer to the electronic component and the carrier.

11. The electronic package of claim 1, wherein roughness of at least one surface of the heat dissipating body is greater than 1.5 µm to form the concave-convex structure.

12. A method for fabricating an electronic package, comprising:
   providing a heat dissipator, comprising:
      a heat dissipating body formed with a concave-convex structure having a plurality of convex portions and a plurality of concave portions, each of the concave portions being between any adjacent two of the convex portions, wherein at least two of the convex portions are ridge-shaped; and
      a supporting leg disposed on the heat dissipating body, wherein the at least two of the convex portions each have, at a bottom thereof, a first lateral side and a second lateral side opposing the first lateral side and differing from the first lateral side in width, and wherein the convex portions are arranged in a manner that the first lateral sides and the second lateral sides are interleaved; and
   bonding the heat dissipator to a carrier having at least one electronic component disposed thereon, with the supporting leg being bonded to the carrier and the heat dissipating body being bonded via a thermal interface layer to the electronic component.

13. The method of claim 12, wherein the heat dissipating body is defined with a first section formed with the concave-convex structure and a second section being adjacent to the first section and formed with a wall structure disposed between the supporting leg and the concave-convex structure.

14. The method of claim 13, wherein the wall structure is bonded via a bonding material to the electronic component.

15. The method of claim 14, wherein the bonding material further extends to the concave-convex structure.

16. The method of claim 14, wherein the bonding material is in contact with the thermal interface layer.

17. The method of claim 13, wherein the second section of the heat dissipating body, the carrier, the electronic component and the supporting leg form an air space.

18. The method of claim 17, wherein the concave portions are formed with an air chamber less than the air space in air pressure.

19. The method of claim 12, further comprising forming an air chamber between the thermal interface layer and the concave portions.

20. The method of claim 12, wherein the thermal interface layer has a complementary shape to the concave-convex structure.

21. The method of claim 12, wherein the heat dissipating body is defined with a first section formed with the concave-convex structure and a second section being adjacent to the first section and bonded via the thermal interface layer to the electronic component and the carrier.

22. The method of claim 12, further comprising controlling, by a positioning device, a thickness of the electronic package.

23. The method of claim 12, further comprising performing an air extracting process while the heat dissipator is bonded to the carrier.

24. The method of claim 12, wherein roughness of at least one surface of the heat dissipating body is greater than 1.5 μm to form the concave-convex structure.

25. A heat dissipator, comprising:
   a heat dissipating body formed with a concave-convex structure having a plurality of convex portions and a plurality of concave portions, each of the concave portions being between any adjacent two of the convex portions, wherein at least two of the convex portions are ridge-shaped; and
   at least one supporting leg disposed on the heat dissipating body, wherein the at least two of the convex portions each have, at a bottom thereof, a first lateral side and a second lateral side opposing the first lateral side and differing from the first lateral side in width, and wherein the convex portions are arranged in a manner that the first lateral sides and the second lateral sides are interleaved.

26. The heat dissipator of claim 25, wherein the heat dissipating body is defined with a first section formed with the concave-convex structure and a second section being adjacent to the first section and formed with a wall structure disposed between the supporting leg and the concave-convex structure.

27. The heat dissipator of claim 25, wherein roughness of at least one surface of the heat dissipating body is greater than 1.5 μm to form the concave-convex structure.

* * * * *

UNITED STATES PATENT AND TRADEMARK OFFICE
CERTIFICATE OF CORRECTION

| | | |
|---|---|---|
| PATENT NO. | : 10,950,520 B2 | Page 1 of 1 |
| APPLICATION NO. | : 16/533716 | |
| DATED | : March 16, 2021 | |
| INVENTOR(S) | : Yu-Lung Huang et al. | |

It is certified that error appears in the above-identified patent and that said Letters Patent is hereby corrected as shown below:

On the Title Page

Item (72) Inventors should read: Yu-Lung Huang, Taichung (TW); Chee-Key Chung, Taichung (TW); Chang-Fu Lin, Taichung (TW); Kuo-Hua Yu, Taichung (TW); Wen-Shan Tsai, Taichung (TW); En-Li Lin, Taichung (TW); Kuan-I Cheng, Taichung (TW); Wei-Ping Wang, Taichung (TW)

Signed and Sealed this
Twenty-fifth Day of May, 2021

Drew Hirshfeld
*Performing the Functions and Duties of the*
*Under Secretary of Commerce for Intellectual Property and*
*Director of the United States Patent and Trademark Office*